United States Patent
Chang et al.

(10) Patent No.: US 10,593,677 B2
(45) Date of Patent: Mar. 17, 2020

(54) SEMICONDUCTOR STRUCTURE WITH CAPACITOR LANDING PAD AND METHOD OF MAKE THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Chieh-Te Chen, Kaohsiung (TW); Yi-Ching Chang, Pingtung County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/947,856

(22) Filed: Apr. 8, 2018

(65) Prior Publication Data

US 2019/0043865 A1    Feb. 7, 2019

(30) Foreign Application Priority Data

Aug. 1, 2017    (CN) .......................... 2017 1 0645803

(51) Int. Cl.
*H01L 27/108*    (2006.01)
*H01L 21/8242*    (2006.01)
(Continued)

(52) U.S. Cl.
CPC .. *H01L 27/10855* (2013.01); *H01L 27/10814* (2013.01); *H01L 27/10823* (2013.01); *H01L 27/10876* (2013.01); *H01L 27/10885* (2013.01); *H01L 27/10888* (2013.01); *H01L 27/10891* (2013.01)

(58) Field of Classification Search
CPC ......... H01L 27/10855; H01L 21/76804; H01L 21/76816; H01L 21/76831; H01L 27/10814
See application file for complete search history.

(56) References Cited

U.S. PATENT DOCUMENTS 6,239,022 B1 * 5/2001 Seo .................. H01L 21/31116
257/E21.252
6,465,299 B1    10/2002 Son
(Continued)

OTHER PUBLICATIONS

Chang, Title of Invention: Pad Structure and Method for Fabricating the Same, U.S. Appl. No. 15/466,881, filed: Mar. 23, 2017.

*Primary Examiner* — Brian Turner
(74) *Attorney, Agent, or Firm* — Winston Hsu

(57) ABSTRACT

The present invention discloses a semiconductor structure with capacitor landing pad and a method for fabricating a capacitor landing pad. The semiconductor structure with capacitor landing pad includes a substrate having a plurality of contact structures, a first dielectric layer disposed on the substrate and the contact structures, and a plurality of capacitor landing pads, each of the capacitor landing pads being located in the first dielectric layer and electrically connected to the contact structure, wherein the capacitor landing pads presents a shape of a wide top and a narrow bottom and a top surface of the capacitor landing pads have a concave shape.

7 Claims, 8 Drawing Sheets

(51) Int. Cl.
*H01L 23/532* (2006.01)
*H01L 21/768* (2006.01)
*H01L 23/528* (2006.01)

(56) References Cited

U.S. PATENT DOCUMENTS

| | | | |
|---|---|---|---|
| 2003/0162353 A1* | 8/2003 | Park | H01L 27/10855 438/253 |
| 2004/0129967 A1* | 7/2004 | Kim | H01L 27/10817 257/306 |
| 2006/0134855 A1* | 6/2006 | Choi | H01L 27/10814 438/239 |
| 2010/0052098 A1* | 3/2010 | Miyajima | H01L 27/10817 257/532 |
| 2010/0055861 A1* | 3/2010 | Ku | H01L 28/90 438/386 |
| 2010/0270647 A1* | 10/2010 | Cho | H01L 28/91 257/532 |
| 2016/0043030 A1 | 2/2016 | Lu | |
| 2016/0172357 A1* | 6/2016 | Song | H01L 29/785 257/401 |
| 2017/0271340 A1* | 9/2017 | Kim | H01L 27/10814 |

\* cited by examiner

SEMICONDUCTOR STRUCTURE WITH CAPACITOR LANDING PAD AND METHOD OF MAKE THE SAME

BACKGROUND OF THE INVENTION

1. Field of the Invention

The present invention relates generally to a method of fabricating a capacitor landing pad. More particularly, the present invention relates to a method for fabricating a landing pad of a storage node in a dynamic random access memory (DRAM) device and the formed structure thereof.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. With the rapid increase in the degree of integration on the DRAM, the size of the capacitor landing pad is also smaller. However, due to the bottleneck of the process technology, an unaligned situation at an exposure step used to define the location of the capacitor landing pad often occurs. The error margin is very small, resulting in the subsequent short circuit between the capacitor landing pads and the bit lines when the capacitor landing pads are formed. Therefore, there still exists many defects in the manufacturing process of the DRAM cell with the buried gate structure, and the efficiency and reliability of the related memory device need to be further improved.

SUMMARY OF THE INVENTION

In order to solve the problems that occur in the DRAM cell manufacturing process, the present invention provides a novel method for fabricating a capacitor landing pad and a capacitor landing pad structure manufactured by the method. The method is characterized in that a reverse tone method of firstly defining the recess of the landing pad and then filling a landing pad metal can effectively solve the problem that the storage node capacitor and the capacitor landing pad are not aligned with each other. A shape design of the landing pad with a wide top and a narrow bottom and a concave top surface can also improve the problem that the error margin between the storage node capacitor and capacitor landing pad is too low and easy to short circuit, and increase the contact area therebetween.

One of the objectives of the present invention is to provide a method of fabricating a capacitor landing pad, including: providing a substrate having a plurality of contact structures therein; forming a first dielectric layer on the substrate; forming a plurality of first recesses in the first dielectric layer, wherein each of the first recesses exposes one of the contact structures and presents a shape of a wide top and a narrow bottom; and filling a contact material in the first recesses to form capacitor landing pads, wherein top surfaces of the capacitor landing pads have a concave shape.

Another objective of the present invention is to provide a capacitor landing pad including a substrate having a plurality of contact structures therein; a first dielectric layer disposed on the substrate and the contact structures; and a plurality of capacitor landing pads, each of the capacitor landing pads being located in the first dielectric layer and electrically connected to the contact structure, wherein the capacitor landing pads presents a shape of a wide top and a narrow bottom and a top surface of the capacitor landing pads have a concave shape.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1A:
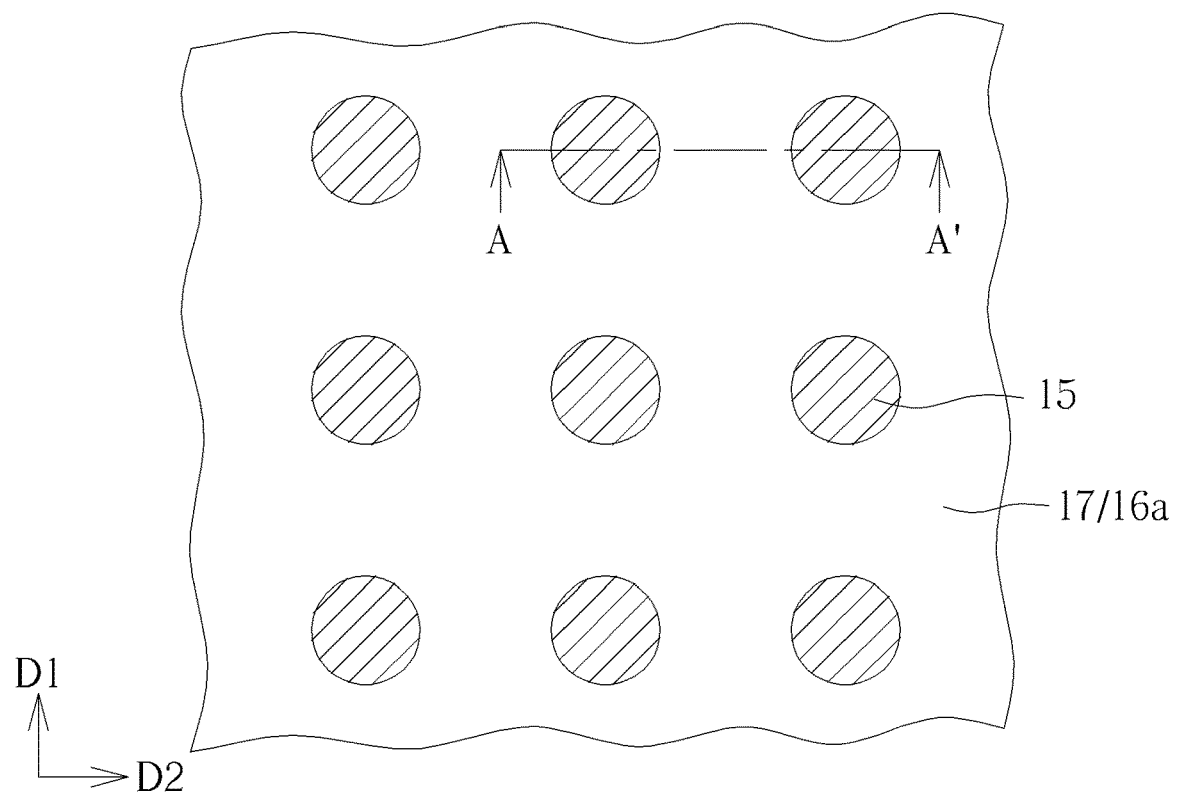
FIG. 1A and FIG. 1B are respectively a schematic top view and a schematic cross-sectional view of a semiconductor structure after forming a storage node contact according to an embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments maybe utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Before describing the preferred embodiment, the following description will be given for specific terms used throughout the specification. The term "etch" or "etching" is used herein to generally describe a fabrication process of patterning a material, such that at least a portion of the material remains after the etch is completed. For example, it should be understood that the process of etching silicon involves the steps of patterning a photoresist layer above the silicon, and then removing the areas of silicon no longer protected by the photoresist layer. As such, the areas of silicon protected by the photoresist layer would remain behind after the etch process is complete. However, in another example, etching may also refer to a process that does not use a photoresist layer, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

The term "substrate," "semiconductor substrate" or "wafer" as described throughout, is most commonly a silicon substrate or a silicon wafer. However, term "substrate" or "wafer" may also refer to any semiconductor material such as germanium, gallium arsenide, indium phosphide, and the like. In other embodiments, the term "substrate" or "wafer" may be non-conductive, such as a glass or sapphire wafer. In addition, the term "capacitor" as used herein refers to a storage node in the architecture of dynamic random access memory (DRAM), it may be different names in other electronic components or memory architecture. This article unifies the term "capacitor" to refer to the part.

Typically, in the processing of DRAM with buried word lines, the word lines, bit lines, source/drain, and capacitor contact plugs are fabricated before fabricating capacitor landing pads and capacitors (storage node) thereon. Since the buried memory process before the capacitor landing pads are formed is not the focus of the method and structure of the present invention, redundant description of the related process will not be given herein in order to avoid obscuring the present invention.

In the drawings of the present invention, FIG. 1 to FIG. 8 sequentially show the structure diagrams of the method for fabricating the capacitor landing pads according to the present invention at each steps. Each figure is divided into two subgraphs A and B, respectively a schematic top view and a schematic cross-sectional view at each step, which clearly shows a connection between elements and elements and a connection between the layer structure and the layer structure and its layout distribution in the semiconductor plane.

Figure 1B:
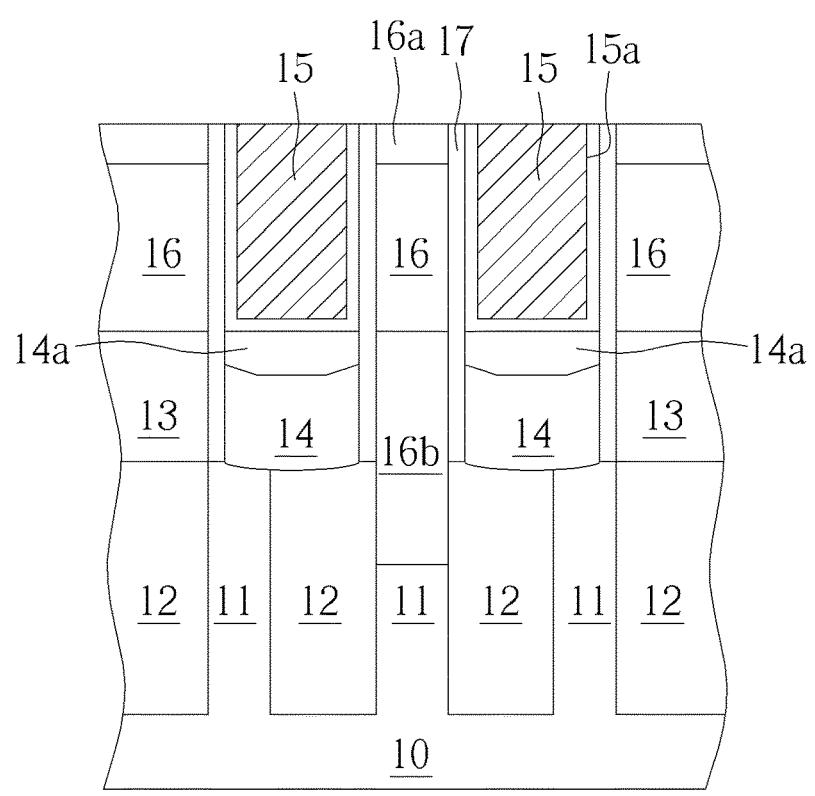

First, please refer to FIG. 1B, which is a schematic cross-sectional view of a semiconductor structure after forming a storage node contact according to an embodiment of the present invention. First, a substrate 10 is provided. A plurality of active areas 11 and shallow trench isolation structures 12 separating the active areas 11 is disposed in the memory region of the substrate 10. A plurality of word lines (not shown) extending along a second direction D2 is buried in the substrate 10 and across the shallow trench isolation structure 12. An interlayer dielectric layer 13 is formed on the active area 11 and the shallow trench isolation structure 12. An epitaxial layer 14 may be optionally disposed in the interlayer dielectric layer 13. A source/drain doped region (not shown) may be disposed in the active area 11 below the epitaxial layer 14 to be electrically connected to the epitaxial layer 14. A storage node contact 15, referred to as a capacitor contact plug, is formed on each of the epitaxial layers 14, which is electrically connected through the silicide 14a formed therebetween. A barrier layer 15a maybe optionally formed on an outer side of the storage node contact 15 to provide a barrier effect. Furthermore, a plurality of bit lines 16 is formed between the storage node contacts 15, extends along a first direction D1, and is perpendicular to the word lines. The bit lines 16 include a bit line mask 16a, such as a silicon nitride layer. In the embodiment of the present invention, the bit line mask 16a is flush with a top surface of the storage node contacts 15. The bit lines 16 are electrically connected with the active area 11 through a bit line contact 16b. It should be noted that only the bit line contact 16b corresponding to the bit line 16 in the middle is shown in the cross-sectional view and the bit line contact of the bit line lines 16 on both sides does not appear in this cross-sectional view. The bit line 16 and the storage node contact 15 are isolated from each other by an insulating layer 17, such as a silicon oxide or silicon nitride layer, to prevent short circuit between the two.

In planar layout, as shown in FIG. 1A, the storage node contacts 15 are arrayed in array on the substrate surface. One storage node contact 15 corresponds to one storage node capacitor formed subsequently. FIG. 1B is a schematic cross-sectional view taken along line AA' in FIG. 1A. It should be noted that, for the sake of simplicity of the illustration, elements which are not particularly related to the present invention in FIG. 1B, such as the barrier layer 15a, the bit line 16, and the word line, are not shown in FIG. 1A, and the bit line mask 16a on the surface thereof is shown together with the insulating layer 17.

Figure 2A:
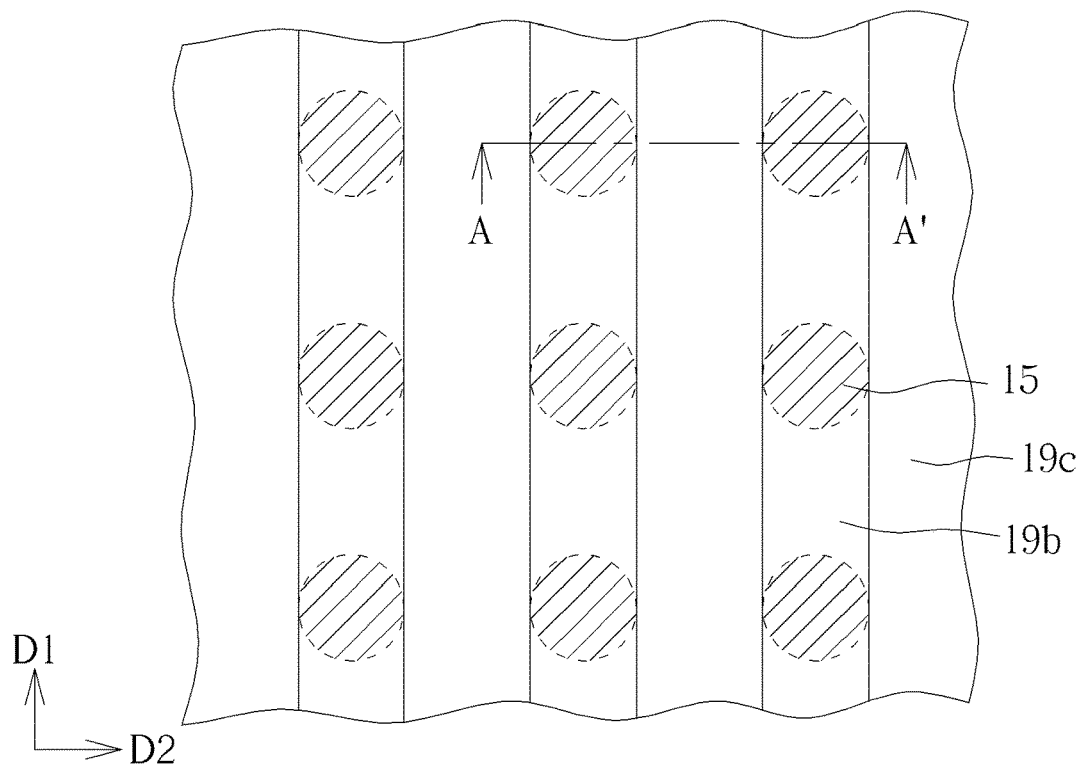
FIG. 2A and FIG. 2B are respectively a schematic top view and a schematic cross-sectional view of the semiconductor structure after a first dielectric layer and a first photoresist are formed on the storage node contact according to an embodiment of the present invention.
Figure 2B:
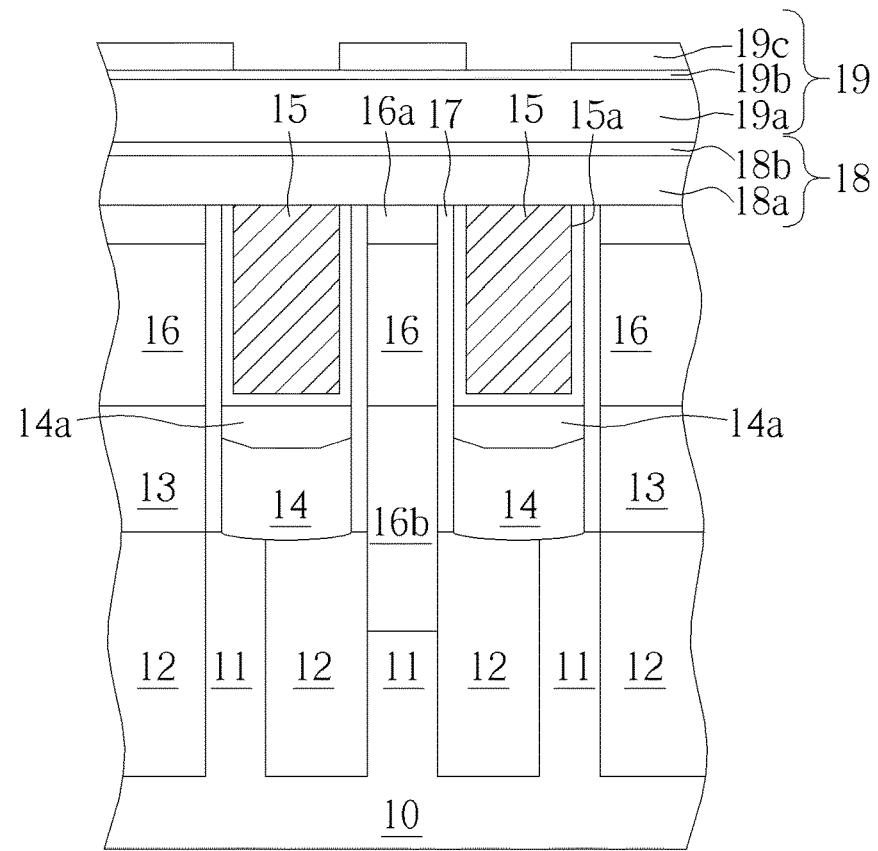

After the pre-process such as the word line, the bit line, the source/drain, and the storage node contact of the buried DRAM has been completed, a capacitor landing pad is manufactured next. Referring to FIG. 2A and FIG. 2B, a first dielectric layer 18 is formed on the substrate 10 to cover the storage node contacts 15. The first dielectric layer 18 includes a lower silicon nitride layer 18a and an upper polysilicon layer 18b. The silicon nitride layer 18a is for accommodating a capacitor landing pad to be formed subsequently, and a thickness of the silicon nitride layer 18a may determine a thickness of the subsequently formed capacitor landing pad. The polysilicon layer 18b is used as a hard mask to define a recess of the landing pad in the subsequent processes. Next, an organic dielectric layer (ODL) 19a, a silicon-containing hard mask bottom anti-reflection coating (SHB) 19b, and a photoresist 19c are sequentially formed on the polysilicon layer 18b, in which the first photoresist 19c is patterned into a plurality of stripe patterns extending along the first direction D1 and not overlapping the storage node contacts 15 below and locating at the positions overlapping with the bit lines 16 below. The organic dielectric layer 19a, the silicon-containing hard mask bottom anti-reflection coating 19b and the first photoresist 19c can be regarded as a continuous multi-layered mask structure 19 in the process.

Figure 3A:
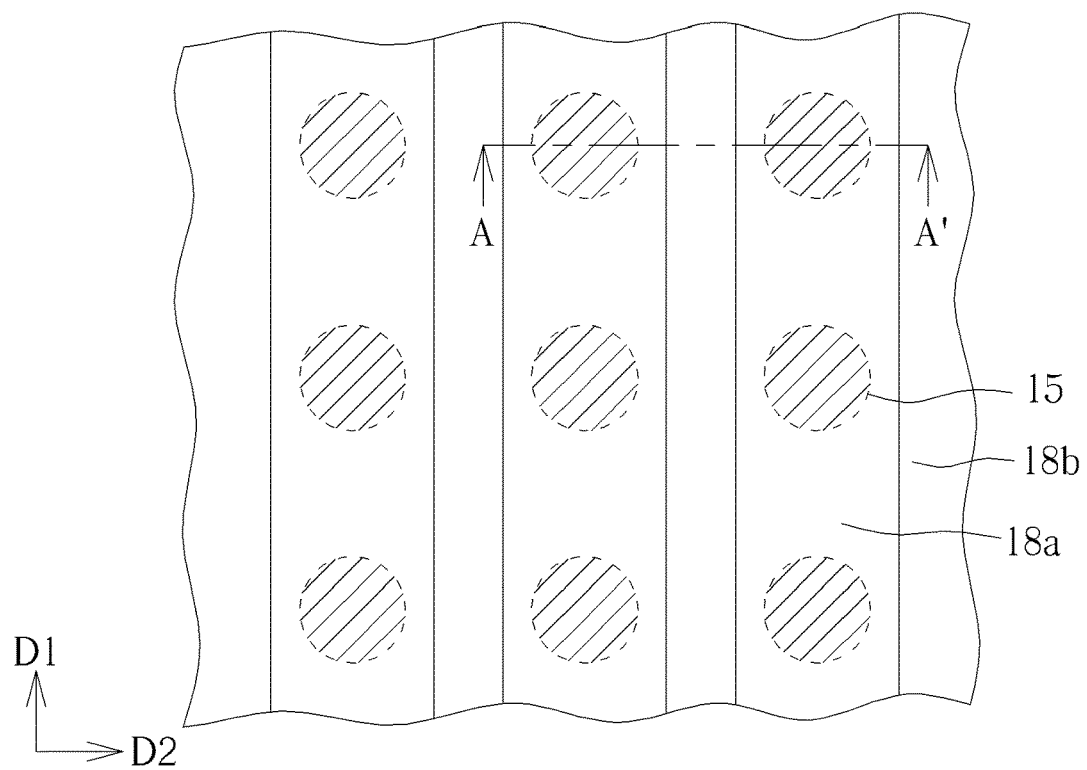
FIG. 3A and FIG. 3B are respectively a schematic top view and a schematic cross-sectional view of the semiconductor structure after performing a first etching process according to an embodiment of the present invention.
Figure 3B:
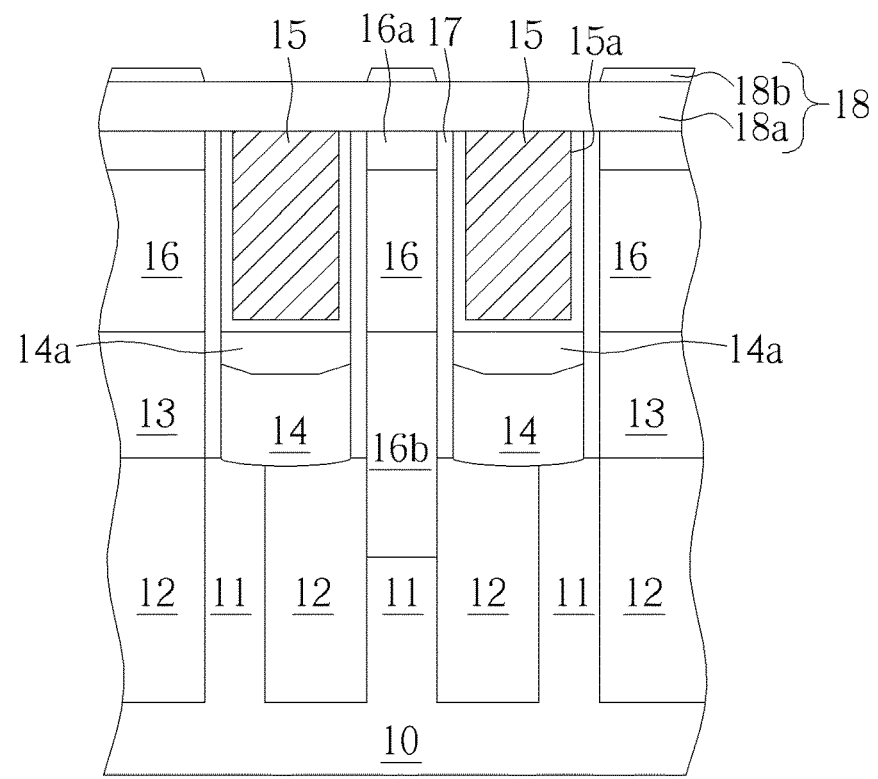

Next, please refer to FIG. 3A and FIG. 3B, after the three-layer continuous mask structure is formed, a plurality of stripe patterns of the first photoresist 19c are first transferred to the organic dielectric layer 19a and the silicon-containing hard mask bottom anti-reflection coating 19b below, and then the first photoresist 19c is removed. Next, a first etching process is performed by using the double-layered structure of the transferred organic dielectric layer 19a and the silicon-containing hard mask bottom anti-reflection coating 19b as an etching mask to transfer the original stripe patterns to the polysilicon layer 18b of the first dielectric layer 18, and then the double-layer structure of the organic dielectric layer 19a and the silicon-containing hard mask bottom anti-reflection coating 19b is removed. In this way, as shown in FIG. 3A, the patterned polysilicon layer 18b also presents a plurality of stripe patterns identical to those of the original first photoresist 19c, which can be used to define the hard mask used for the recess of the landing pad in the first direction D1 of in the subsequent processes. The silicon nitride layer 18a of the first dielectric layer 18 is not affected by the patterning described above.

Figure 4A:
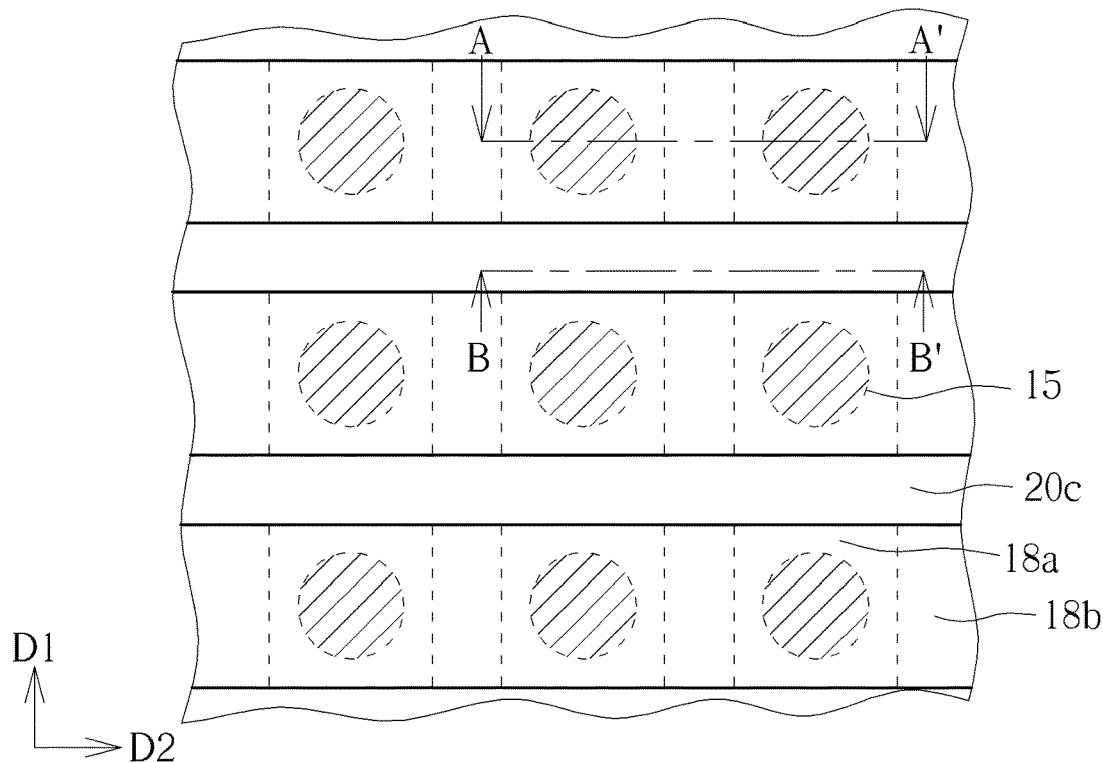
FIG. 4A and FIG. 4B are respectively a schematic top view and a schematic cross-sectional view of the semiconductor structure after forming a second photoresist on the first dielectric layer according to an embodiment of the present invention.
Figure 4B:
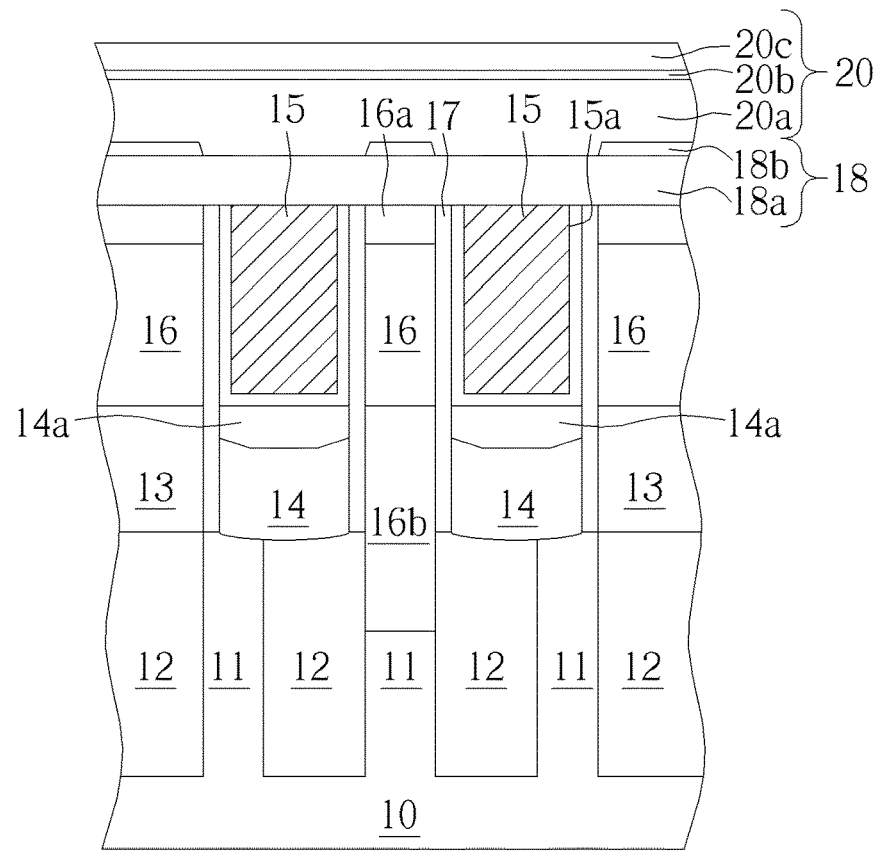

After the definition of the landing pad recess in the first direction D1 is completed, the definition of the landing pad recess in a second direction D2 is to be performed next. Please refer to FIG. 4A and FIG. 4B. An organic dielectric layer 20a, a silicon-containing hard mask bottom anti-reflection coating 20b, and a second photoresist 20c are sequentially formed on the silicon nitride layer 18a to cover the stripe-shaped polysilicon layer 18b, wherein the second photoresist 20c is patterned into a plurality of stripe patterns extending along the second direction D2 and not overlapping the storage node contacts 15 below and locating at the positions overlapping with the bit lines 16 below, which is the same as the first photoresist 19c. Similarly, the organic dielectric layer 20a, the silicon-containing hard mask bottom anti-reflection coating 20b, and the second photoresist 20c can be regarded as a continuous multi-layered mask structure 20 used to define the scope of the recess of the landing pad in the second direction D2 of in the subsequent processes. Different from the other cross-sectional views, it should be noted that FIG. 4B is taken along line BB' in FIG. 4A, not line AA', to express complete coating situation of the three-layer mask structure 20a/20b/20c on the first dielectric layer 18. A non-overlapping region defined by the intersection of the patterned polysilicon layer 18b and the patterned second photoresist 20c is the position where the landing pad is to be formed according to the present invention.

Figure 5A:
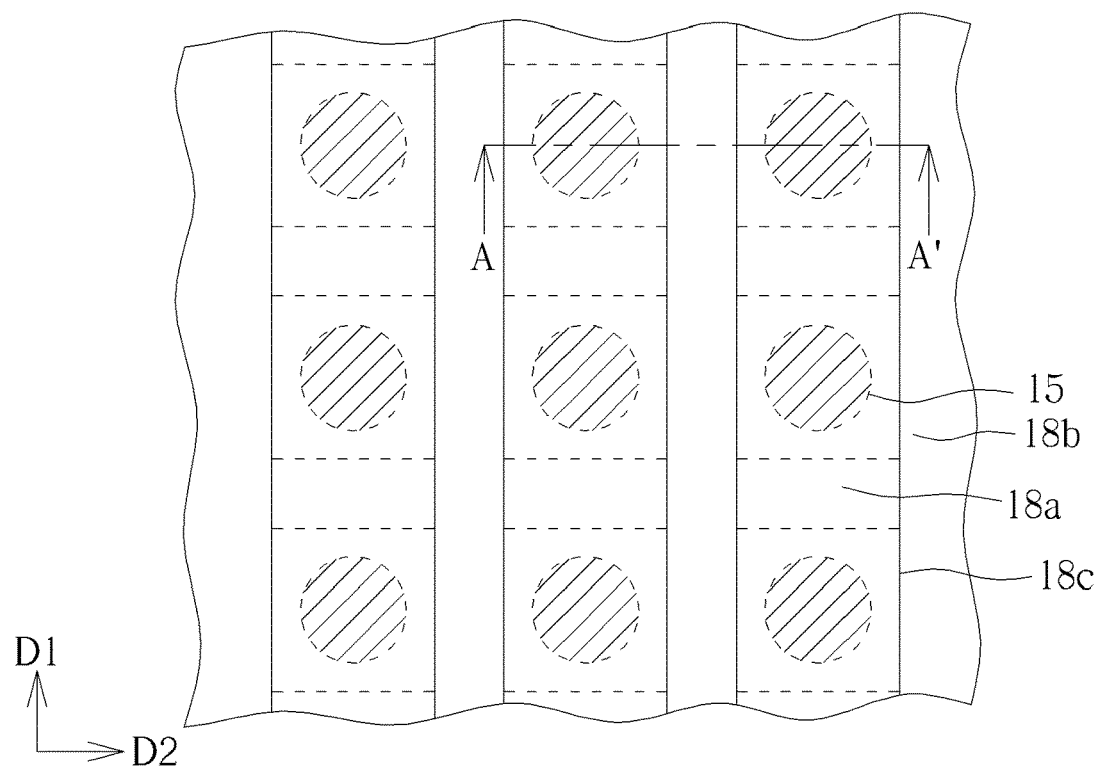
FIG. 5A and FIG. 5B are respectively a schematic top view and a schematic cross-sectional view of the semiconductor structure after a first recess formed by a second etching process according to an embodiment of the present invention.
Figure 5B:
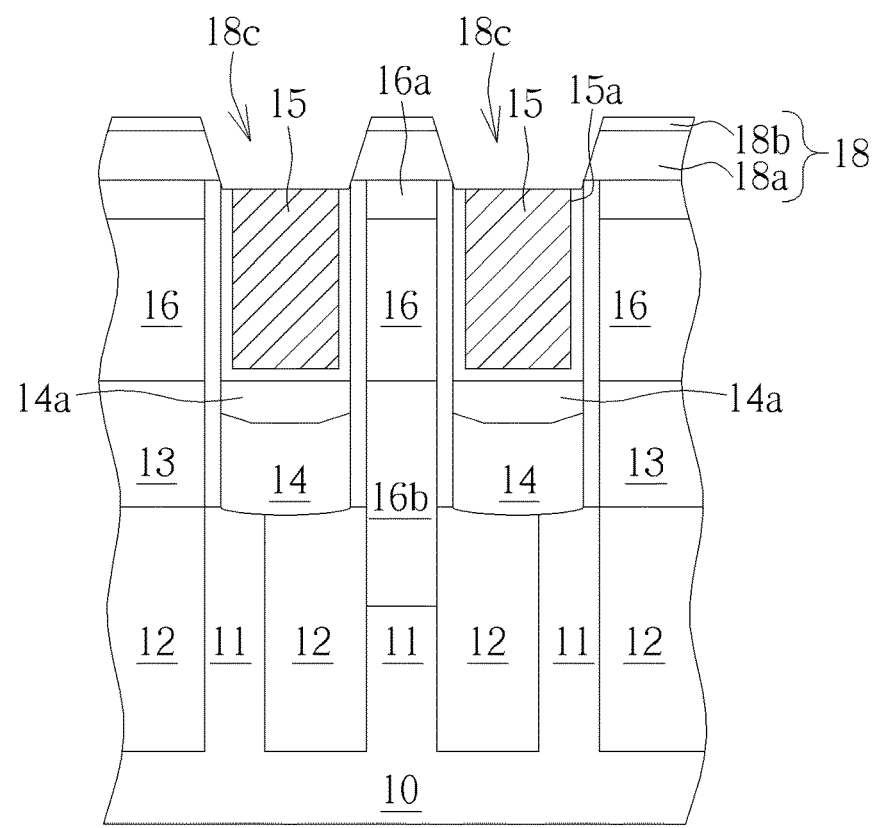

After the three-layer continuous mask structure is formed, as in the previous steps of FIG. 2A and FIG. 2B, a plurality of stripe patterns of the second photoresist 20c are first transferred to the organic dielectric layer 20a and the silicon-containing hard mask bottom anti-reflection coating 20b below, and then the second photoresist 20c is removed, thereby completing a definition of an etch mask of the landing pad patterns. Next, referring to FIG. 5A and FIG. 5B, a second etching process is performed by using an etching mask including the double-layered structure of the transferred organic dielectric layer 20a and the silicon-containing bottom anti-reflection coating 20b and the patterned polysilicon layer 18b formed previously to etching the exposed silicon nitride layer 18a, thereby forming a landing pad recess 18c in the silicon nitride layer 18a. Each landing pad recess 18c exposes the storage node contacts 15 thereunder. The dashed lines in FIG. 5A show the turning lines of the silicon nitride layer 18a in different planes after the etching process. It should be noted that in the embodiment of the present invention, the second etching process is an anisotropic process, so that the sidewall layer of the etched silicon nitride layer 18a present a type of gradually tilt extending from the outside toward the center so that the entire landing pad recess 18c has a shape of a wide top and a narrow bottom, which is a major feature of the present invention.

Figure 6A:
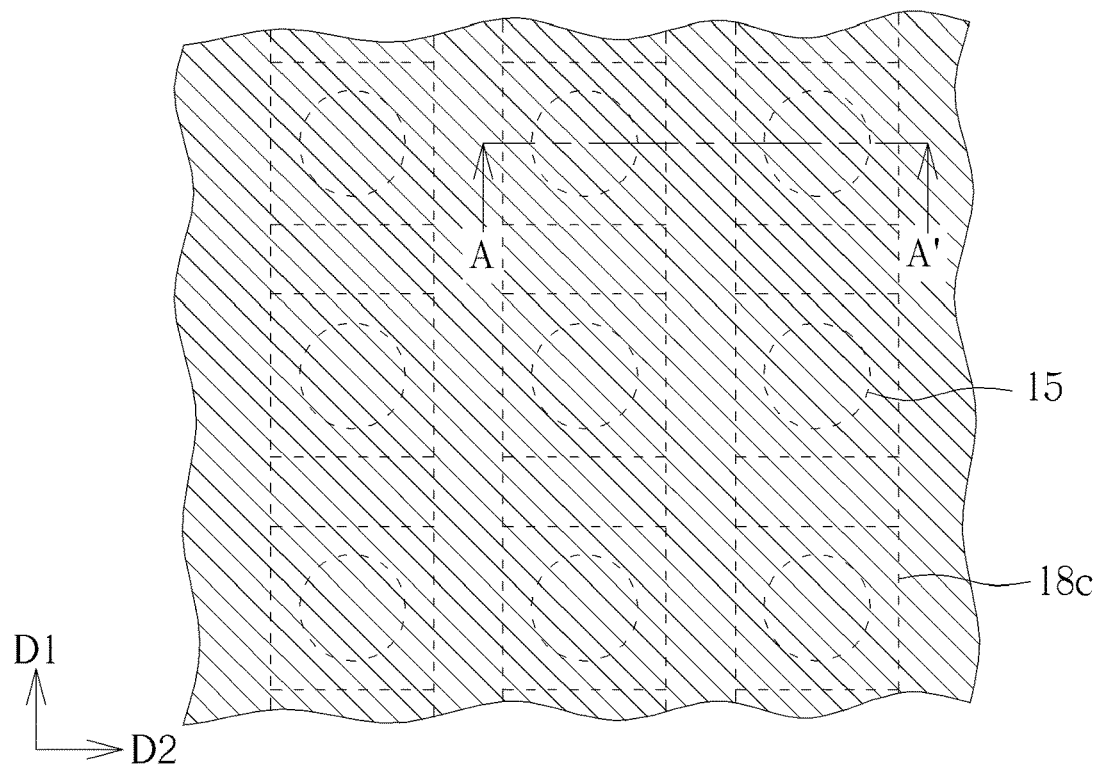
FIG. 6A and FIG. 6B are respectively a schematic top view and a schematic cross-sectional view of the semiconductor structure after forming a contact material on the first dielectric layer and in the first recess according to an embodiment of the present invention.
Figure 6B:
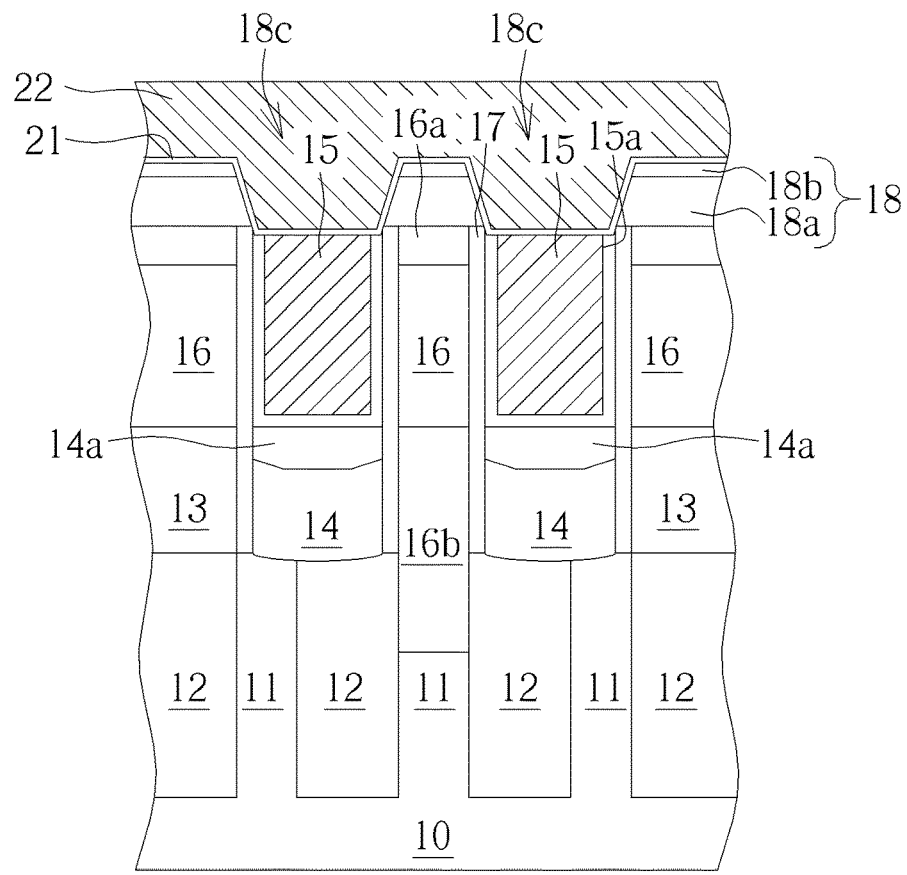

After the landing pad recess 18c is formed, as shown in FIG. 6A and FIG. 6B, a barrier layer 21, such as a titanium nitride layer, is first conformally formed on the first dielectric layer 18 and the storage node contacts 15. Then, a contact material layer 22, such as a tungsten metal layer, is formed to cover the barrier layer 21 and fill the landing pad recess 18c. The contact material layer 22 serves as a material for forming a capacitor landing pad in a subsequent process.

Figure 7A:
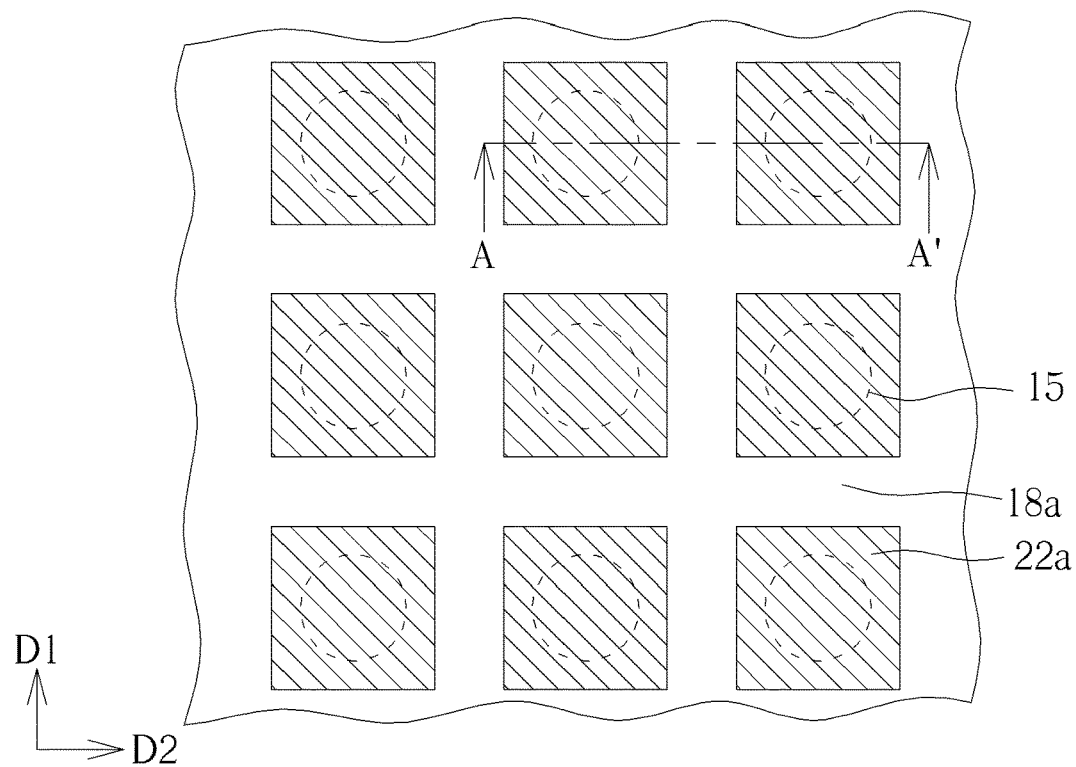
FIG. 7A and FIG. 7B are respectively a schematic top view and a schematic cross-sectional view of the semiconductor structure after a capacitor landing pad is formed through an etching back process according to an embodiment of the present invention.
Figure 7B:
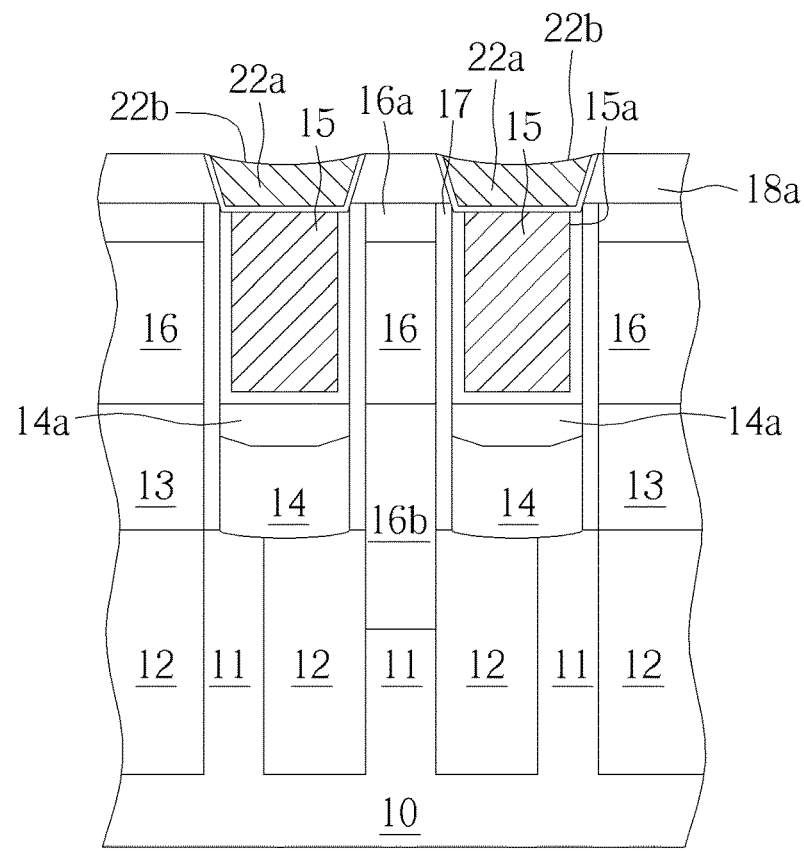

After forming the barrier layer 21 and the contact material layer 22, as shown in FIG. 7A and FIG. 7B, an etching back process is performed to remove the contact material layer 22 outside the landing pad recess 18c so that the remained contact material layer 22 in the landing pad recess 18c forms capacitor landing pads 22a. The formed capacitor landing pads 22a are arranged in an array pattern on the substrate plane and are respectively electrically connected with the storage node contacts 15 below. The etching back process also removes the barrier layer 21, the polysilicon layer 18b, and a portion of the silicon nitride layer 18a, surrounding the landing pad recess 18c. It should be noted that in the embodiment of the present invention, since the etching back process has a slightly larger etching rate for the contact material layer 22, a top surface 22b of the capacitor landing pads 22a have a concave shape after the etching back process is completed. This feature helps to provide a larger contact area in the connection of the subsequent storage node capacitance with the capacitor landing pads 22a.

Figure 8A:
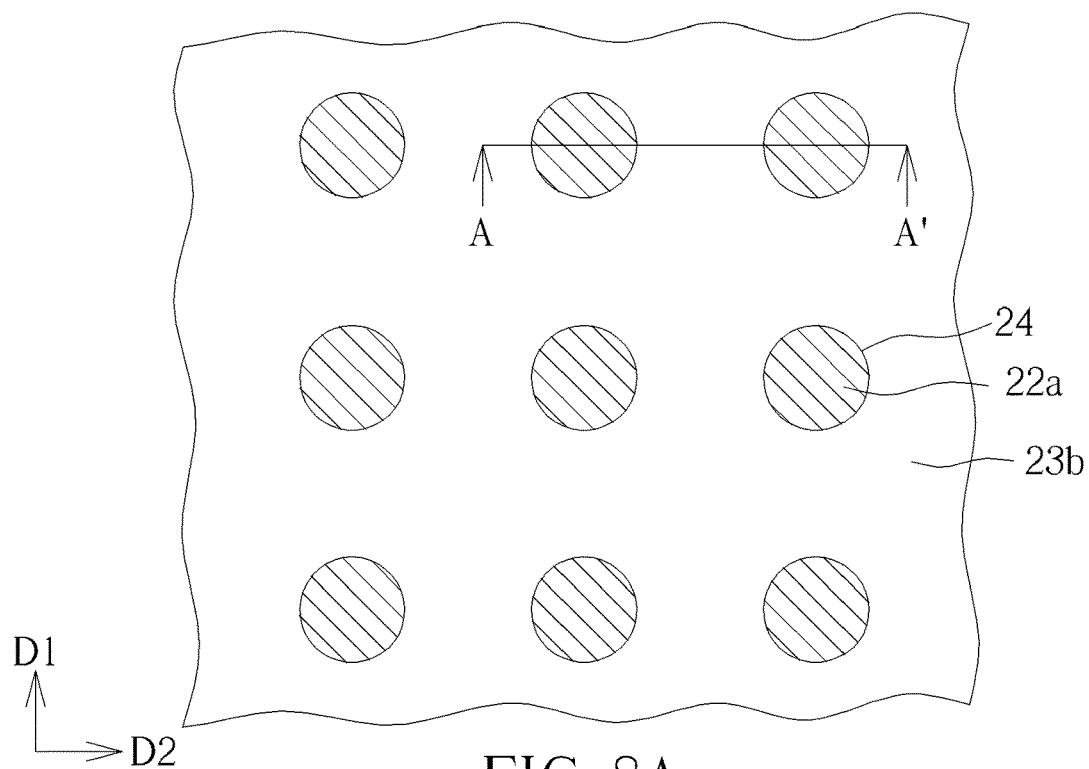
FIG. 8A and FIG. 8B are respectively a schematic top view and a schematic cross-sectional view of the semiconductor structure after forming a second dielectric layer and a second recess on the capacitor landing pad according to an embodiment of the present invention.
Figure 8B:
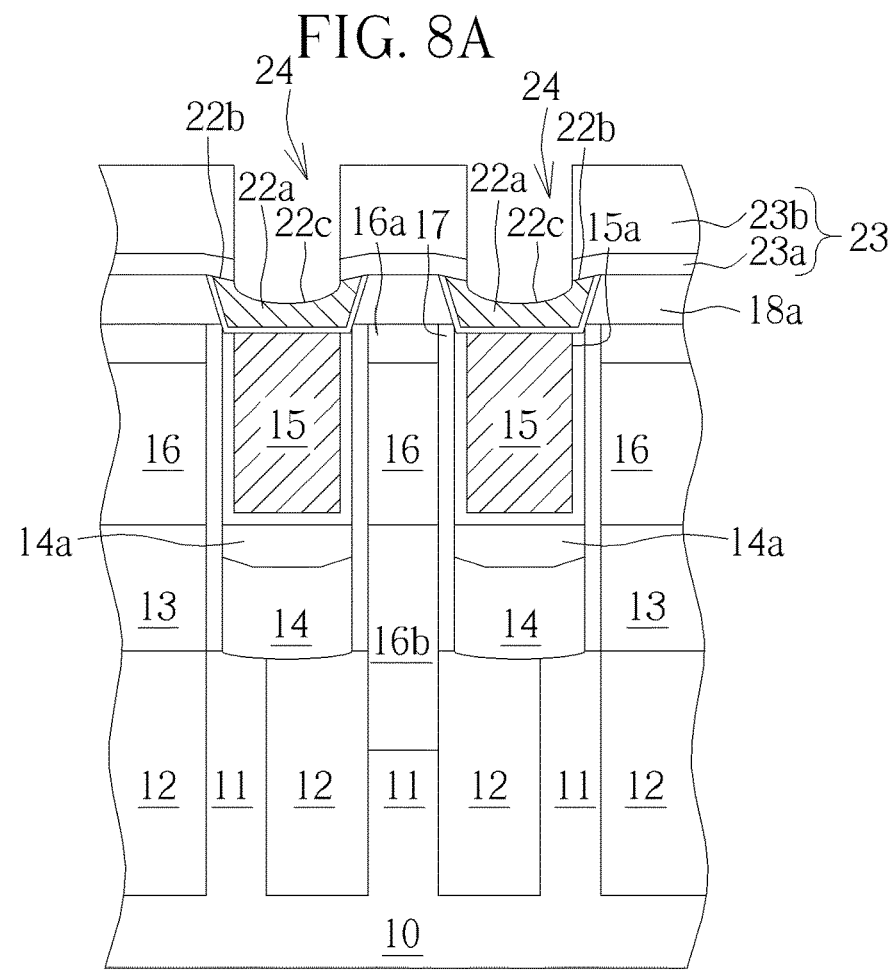

After forming the capacitor landing pads 22a, as shown in FIG. 8A and FIG. 8B, a second dielectric layer 23 may be formed on the capacitor landing pads 22a and the silicon nitride layer 18a, which may include a two-layer structure composed of a low dielectric constant material such as a silicon carbonitride (SiCN) layer 23a and silicon oxide 23b, and then a photolithography process is performed to obtain a capacitor recess 24 in the second dielectric layer 23, which exposes the capacitor landing pads 22a below. It should be noted that in the embodiment of the present invention, a portion of the capacitor landing pads 22a may be removed during the photolithography process, and since the top surface 22b of the capacitor landing pads 22a already have a concave shape before the photolithography process, the recessed area of the portion of the top surface 22b of the capacitor landing pads 22a exposed from the capacitor recess 24 after the photolithography process is further enlarged to form another top surface 22c with a large concave width. The advantage of this feature is that the contact area provided by the capacitor landing pads 22a can be increased to achieve better capacitive contact efficiency.

After forming the capacitor landing pads 22a and the capacitor recesses 24 having the aforementioned features, a storage node/capacitor structure (not shown) may then be formed in the capacitor recesses 24. Since the capacitor structure is not a relevant point of the present invention, the details of the related process will not be described in the text and drawings in order to avoid obscuring the emphasis of the present invention.

In addition to the features of the present invention described above, a major focus of the process of the present invention is that the capacitor landing pads 22a adopts a reverse tone process in which the landing pad recess is formed first and the contact material is then filled in. The advantages of this method is that the shape of the capacitor landing pad 22a is determined by the definition of the landing pad recess 18c instead of forming the material layer and then patterning to a landing pad as in the conventional practice. According to the principle of the reverse tone method, anisotropic etching may be used in the process and the depth of the landing pad recess (that is, a thickness of the silicon nitride layer 18a) may be controlled to obtain a tapered shape of the capacitor landing pad having a wide top and a narrow bottom as required. The advantage of this feature is that the capacitor landing pad has a larger top surface, which can not only provide a larger offset tolerance when defining the landing pad recesses by the photolithographic process, but also provide larger contact area and offset tolerance for subsequent alignment with the capacitor structure. In addition, the bottom surface of the capacitor landing pad having the tapered type may be reduced to the same area as the storage node contacts, which can solve the problem that the capacitor landing pad in the conventional method has a contact area larger than that of the storage node contacts and easily short circuits with the adjacent bit line mask.

According to the above process of the capacitor landing pad, the present invention also proposes a novel capacitor landing pad including a substrate 10 having a plurality of contact structures 15 therein; a first dielectric layer 18 disposed on the substrate 10 and the contact structures 15; and a plurality of capacitor landing pads 22a, each of the capacitor landing pads 22a being located in the first dielectric layer 18 and electrically connected to the contact structure 15, wherein the capacitor landing pads 22a presents a shape of a wide top and a narrow bottom and a top surface 22b/22c of the capacitor landing pads have a concave shape.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a capacitor landing pad, comprising:
    providing a substrate having a plurality of contact structures therein;
    forming a first dielectric layer on the substrate;
    forming a plurality of first recesses in the first dielectric layer, wherein each of the first recesses exposes one of the contact structures and presents a shape of a wide top and a narrow bottom, and steps of forming the first recesses in the first dielectric layer further comprises:
        forming a first photoresist on the first dielectric layer, wherein the first photoresist presents a plurality of stripe patterns extending along a first direction and does not overlap the contact structures below;
        performing a first etching process to remove a portion of the first dielectric layer by using the first photoresist as an etching mask;
        forming a second photoresist on the first dielectric layer, wherein the second photoresist presents a plurality of stripe patterns extending along a second direction and does not overlap the contact structures below; and
        performing a second etching process to remove a portion of the first dielectric layer by using the second photoresist as an etching mask to expose the contact structures below; and
    filling a contact material in the first recesses to form capacitor landing pads, wherein top surfaces of the capacitor landing pads have a concave shape.

2. The method of fabricating a capacitor landing pad according to claim 1, the method further comprises:
    forming a second dielectric layer on the capacitor landing pads; and forming a second recess in the second dielectric layer to expose the capacitor landing pad, wherein a portion of the capacitor landing pad is removed in a step of forming the second recess such that the top surface of the capacitor landing pad is recessed greater in amplitude.

3. The method of fabricating a capacitor landing pad according to claim 2, further comprising forming a storage node in the second recess.

4. The method of fabricating a capacitor landing pad according to claim 1, wherein the first dielectric layer comprises a silicon nitride layer and a polysilicon layer, and the first etching process removes only an exposed polysilicon layer.

5. The method of fabricating a capacitor landing pad according to claim 4, wherein the second etching process removes an exposed silicon nitride layer and exposes the contact structures below by using the second photoresist and a remained polysilicon layer as the etching mask as an etching mask.

6. The method of fabricating a capacitor landing pad according to claim 1, wherein a step of filling a contact material in the first recesses to form capacitor landing pads further comprises:
    forming the contact material on the first dielectric layer, wherein the contact material fills the first recess and connects with the contact structures; and
    performing an etching back process to remove the contact material outside the first recess to form the capacitor landing pads and to make the top surfaces of the capacitor landing pads present the concave shape.

7. The method of fabricating a capacitor landing pad according to claim 1, further comprising forming a barrier layer on the first dielectric layer and the first recess before filling the contact material.

* * * * *